US012603646B2

(12) United States Patent
Lebedev

(10) Patent No.: US 12,603,646 B2
(45) Date of Patent: Apr. 14, 2026

(54) TRACK AND HOLD CIRCUIT

(71) Applicant: Huawei Technologies Co., Ltd., Shenzhen (CN)

(72) Inventor: Semyon Lebedev, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 91 days.

(21) Appl. No.: 18/639,531

(22) Filed: Apr. 18, 2024

(65) Prior Publication Data

US 2025/0330175 A1 Oct. 23, 2025

(51) Int. Cl.
*H03K 17/687* (2006.01)

(52) U.S. Cl.
CPC .................................. *H03K 17/6871* (2013.01)

(58) Field of Classification Search
CPC .................................................. H03K 17/6871
See application file for complete search history.

(56) References Cited

U.S. PATENT DOCUMENTS

| | | | | | |
|---|---|---|---|---|---|
| 6,018,260 A | * | 1/2000 | Gabara | ................... | H03M 9/00 |
| | | | | | 327/212 |
| 11,695,377 B2 | * | 7/2023 | Van Veldhoven | ...... | H03F 3/387 |
| | | | | | 330/291 |

FOREIGN PATENT DOCUMENTS

| | | | | | |
|---|---|---|---|---|---|
| KR | 20240030184 A | * | 3/2024 | ........... | H03K 5/1532 |

OTHER PUBLICATIONS

Simon M. Louwsma et al., "A Time-Interleaved Track & Hold in 0.13μm CMOS sub-sampling a 4 GHz Signal with 43dB SNDR," IEEE 2007 Custom Intergrated Circuits Conference (CICC), 4 pages.

Jaime Ramirez-Angulo et al., "New Improved CMOS Class AB Buffers Based on Differential Flipped Voltage Followers," 2006 IEEE International Symposium on Circuits and Systems, pp. 3914-3917.

Yizhak Shifman et al., "A 1.64mW Differential Super Source-Follower Buffer with 9.7GHz BW and 43dB PSRR for Time-Interleaved ADC Applications in 10nm," IEEE Asian Solid-State Circuits Conference, Nov. 4-6, 2019, The Parisian Macao, Macao SAR, China, pp. 235-238.

* cited by examiner

*Primary Examiner* — Metasebia T Retebo
(74) *Attorney, Agent, or Firm* — Slater Matsil, LLP

(57) ABSTRACT

Provided is a track and hold circuit. The track and hold circuit includes: a CMOS FVF; a pair of first switches, each of the first switches being coupled between a corresponding one of differential signal inputs and a corresponding one of differential inputs of the FVF; a second switch coupled between differential outputs of the FVF; the FVF includes a pair of first transistors with gates being differential inputs of the FVF and sources being the differential outputs of the FVF, a pair of second transistors, a first current mirror transistor, a second current mirror transistor and a third switch; where a state of the second switch is controlled by a clock signal to be the same as a state of the first switches, and a state of the third switch is controlled to be complementary to the state of the second switch.

9 Claims, 12 Drawing Sheets

| CLK | TRACK | HOLD | TRACK | HOLD |
|---|---|---|---|---|
| SW1,2,6 | ON | OFF | ON | OFF |
| SW3,4,5 | OFF | ON | OFF | ON |

FIG. 4C $$Vout = Vin + Vout*Cpar2/(Cin+Cpar2) = Vin + Vout*A$$
$$Vout = Vin/(1-A)$$

TRACK AND HOLD CIRCUIT

TECHNICAL FIELD

The present disclosure relates to the field of technologies of electronics, and in particular, to a track and hold circuit.

BACKGROUND

A track and hold buffer is an important part of serializer/ deserializer (SERDES) receiver (RX) systems, and is the first step for conversion of the input analog signal into the output digital signal. A flipped voltage follower (FVF) is a voltage buffer with simple structure that can be used in the track and hold buffer.

The output voltage of the track and hold buffer may converge by the end of the hold phase to follow the input voltage sampled at the buffer input at the end of the track phase. It is necessary for the output voltage to timely track the change of the input voltage.

This background information is provided to reveal information believed by the applicant to be of possible relevance to the present disclosure. No admission is necessarily intended, nor should be construed, that any of the preceding information constitutes prior art against the present disclosure.

SUMMARY

A track and hold circuit is provided by the present disclosure, where the track and hold circuit comprises:

a Complementary Metal Oxide Semiconductor (CMOS) flipped voltage follower (FVF) having a pair of differential inputs and a pair of differential outputs;

a pair of first switches, each of the first switches being coupled between a corresponding one of a pair of differential signal inputs and a corresponding one of the pair of differential inputs of the FVF;

a second switch coupled between the pair of differential outputs of the FVF;

wherein the FVF comprises a pair of first transistors with gates being the differential inputs of the FVF and sources being the differential outputs of the FVF, a pair of second transistors, a first current mirror transistor, a second current mirror transistor and a third switch; wherein the first current mirror transistor is coupled between a first supply and sources of the second transistors; drains of the second transistors are respectively coupled to sources of the first transistors, drains of the first transistors are respectively coupled to first ends of first resistors, and second ends of the first resistors are connected to a second supply;

wherein the second current mirror transistor is coupled between the first supply and a first end of the third switch, and a second end of the third switch is coupled to the sources of the second transistors; wherein gates of the first current mirror transistor and the second current mirror transistor are coupled to a bias voltage;

wherein the FVF is configured to receive a pair of differential input signals from the pair of differential signal inputs through the pair of differential inputs of the FVF, and output a pair of differential output signals through the pair of differential outputs of the FVF;

wherein a state of the second switch is controlled by a clock signal to be the same as a state of each of the first switches, and a state of the third switch is controlled to be complementary to the state of the second switch.

BRIEF DESCRIPTION OF THE DRAWINGS

The accompanying drawings are used to provide a further understanding of the present disclosure, constitute a part of the specification, and are used to explain the present disclosure together with the following specific embodiments, but should not be construed as limiting the present disclosure.

FIG. 4C is a timing diagram of a clock signal for the modified track and hold buffer according to one or more embodiments of the present disclosure.

DETAILED DESCRIPTION OF ILLUSTRATIVE EMBODIMENTS

In the following description, reference is made to the accompanying figures, which form part of the present disclosure, and which show, by way of illustration, specific aspects of embodiments of the present disclosure or specific aspects in which embodiments of the present disclosure may be used. It is understood that embodiments of the present disclosure may be used in other aspects and include structural or logical changes not depicted in the figures. The following detailed description, therefore, is not to be taken in a limiting sense, and the scope of the present disclosure is defined by the appended claims.

Figure 1A:
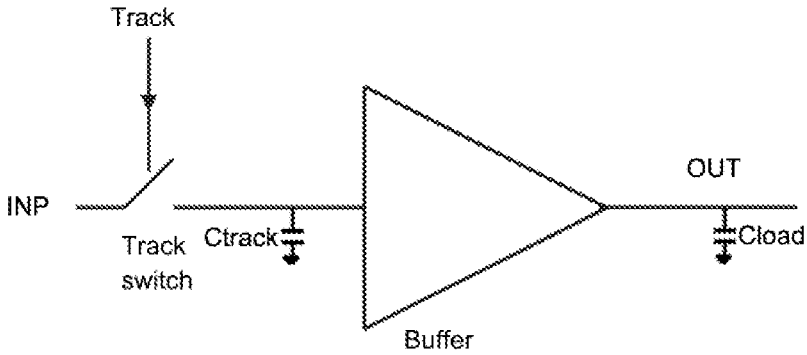
FIG. 1A is a schematic diagram of a track and hold buffer according to one or more embodiments of the present disclosure.

A track and hold (T&H) buffer is an important part of serializer/deserializer (SERDES) receiver (RX) systems, being the first step for conversion of an analog input signal into output digital code. FIG. 1A is a schematic diagram of an ideal track and hold buffer. As shown in FIG. 1A, an ideal T&H buffer includes a track switch, a capacitor Ctrack for storing a sampled signal and a buffer for separation Ctrack from a load capacitor Cload. For simplicity, a single-end version is shown in FIG. 1A, but in RX system implementation it is used always a differential version of this circuit.

Figure 1B:
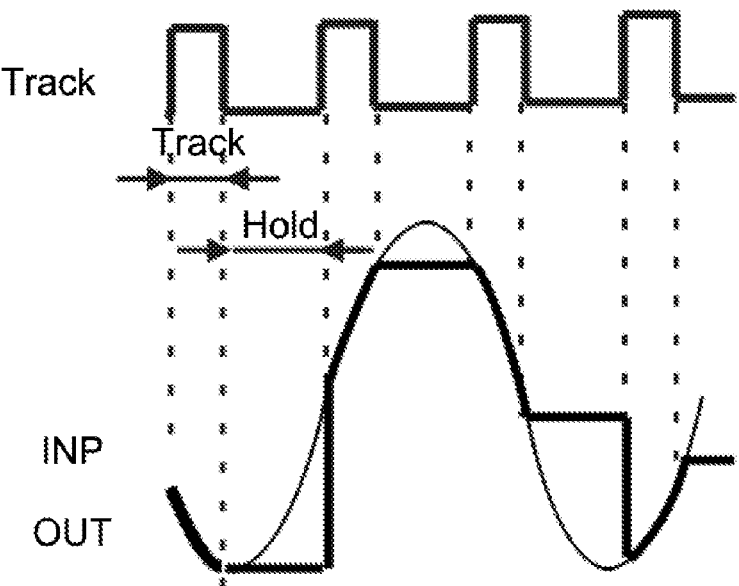
FIG. 1B illustrates control waveforms, input and output waveforms associated with the track and hold buffer of FIG. 1A according to one or more embodiments of the present disclosure.

FIG. 1B illustrates control waveforms, input and output waveforms associated with the ideal track and hold buffer of FIG. 1A. Operation of the track and hold buffer will be briefly introduced with reference to FIGS. 1A and 1B. The track switch is controlled by a track signal as shown in top part of FIG. 1B, e.g., a high level of the track signal (track phase) triggers the track switch to be conductive; while a low level of the track signal (hold phase) triggers the track switch to be non-conductive. Continuous analog input signal at the buffer input is converted into a train of DC analog levels being constant towards the end of the hold phase and ready for further processing.

It should be noted that, in real systems, usually, before a next sample, an active pulse of an additional reset signal may be inserted between hold and track phases in order to clean possible memory of the previous sample. Also in interleaved RX ranking system, to the same analog input there can be connected a number of Track and Hold buffers with interleaving Track switch controls (first rank of interleaving), while at the output, there can be connected multiple interleaved sample and hold circuits with interleaved sample switches controls (second rank of interleaving).

The total signal to noise and distortion ratio (SNDR) of an RX system over all target input signal frequencies range sets requirements for the T&H buffer. Parameters associated with a specific T&H buffer may include: input/output Dynamic range, RMS (Root Mean Square) noise, input frequency range, THD (Total Harmonic Distortion), input/output common mode for differential design (not equal each other), etc.

Since the T&H buffer is a close loop system amplifier with ~0 dB gain, like for any amplifier, parameters such as DC gain, phase margin, bandwidth, power consumption and the like are valid.

For modern high-frequency sampling clock systems (e.g., 100 GS/s), since the buffer bandwidth is limited (typical ~10-15 GHz for known low power consuming designs), in order to support high frequency input range up to 50 GHz (Nyquist), the bandwidth of the track switch should be approached separately from the buffer bandwidth. By the end of Track signal the final input DC value sampled at the end of Track event is stored on Ctrack. The buffer output should converge to the input DC signal level stored on Ctrack towards the end of the hold phase.

In the T&H buffer, a flipped voltage follower (FVF) may be taken as an example of the buffer, there may be other types of buffers, which is not limited in the present disclosure.

Figure 2A:
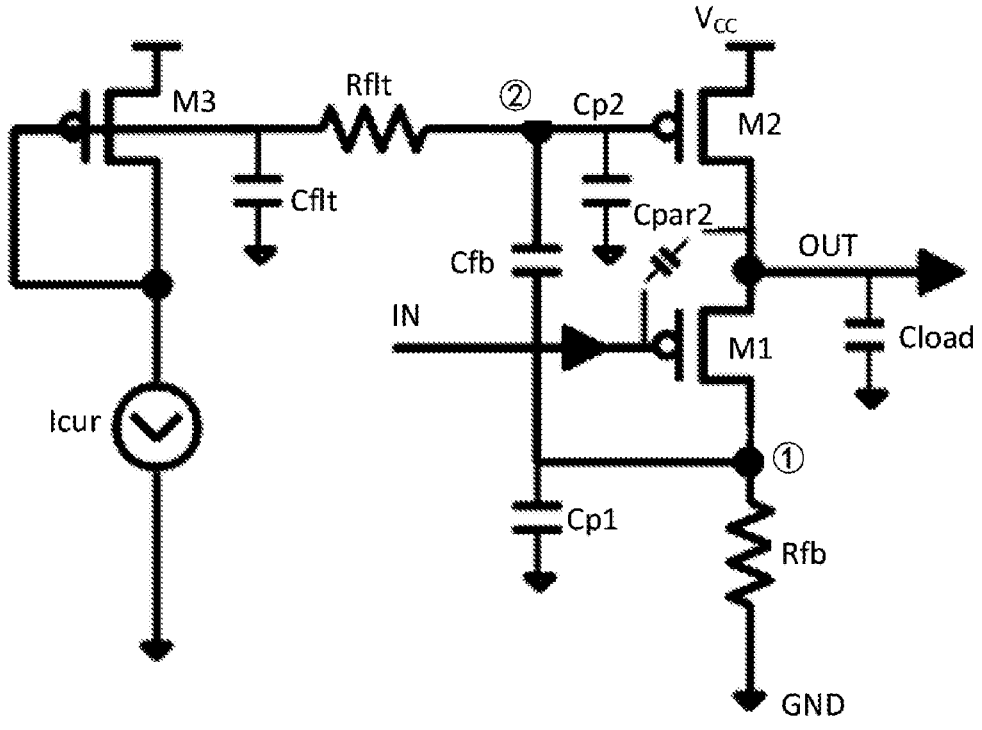
FIG. 2A is a schematic diagram of a conventional FVF single-end buffer with capacitive feedback.
Figure 2B:
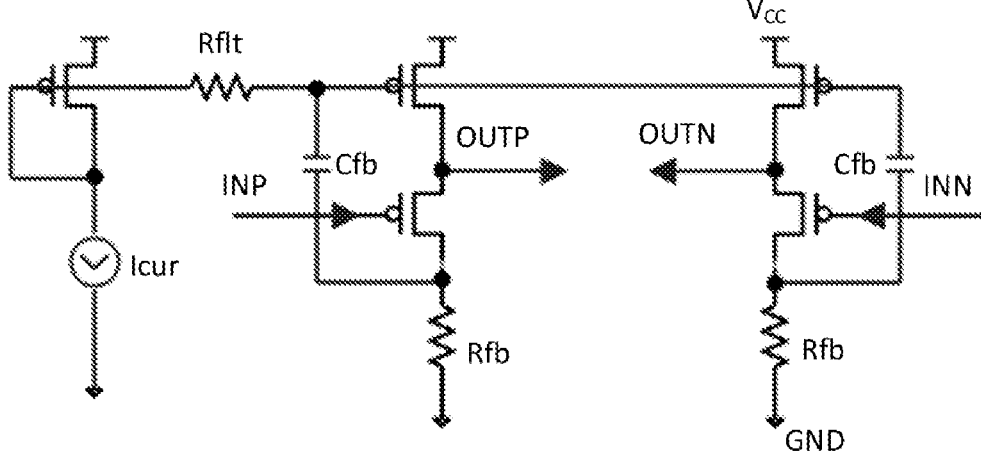
FIG. 2B is a schematic diagram of a differential version of the same buffer in FIG. 2A.
Figure 2C:
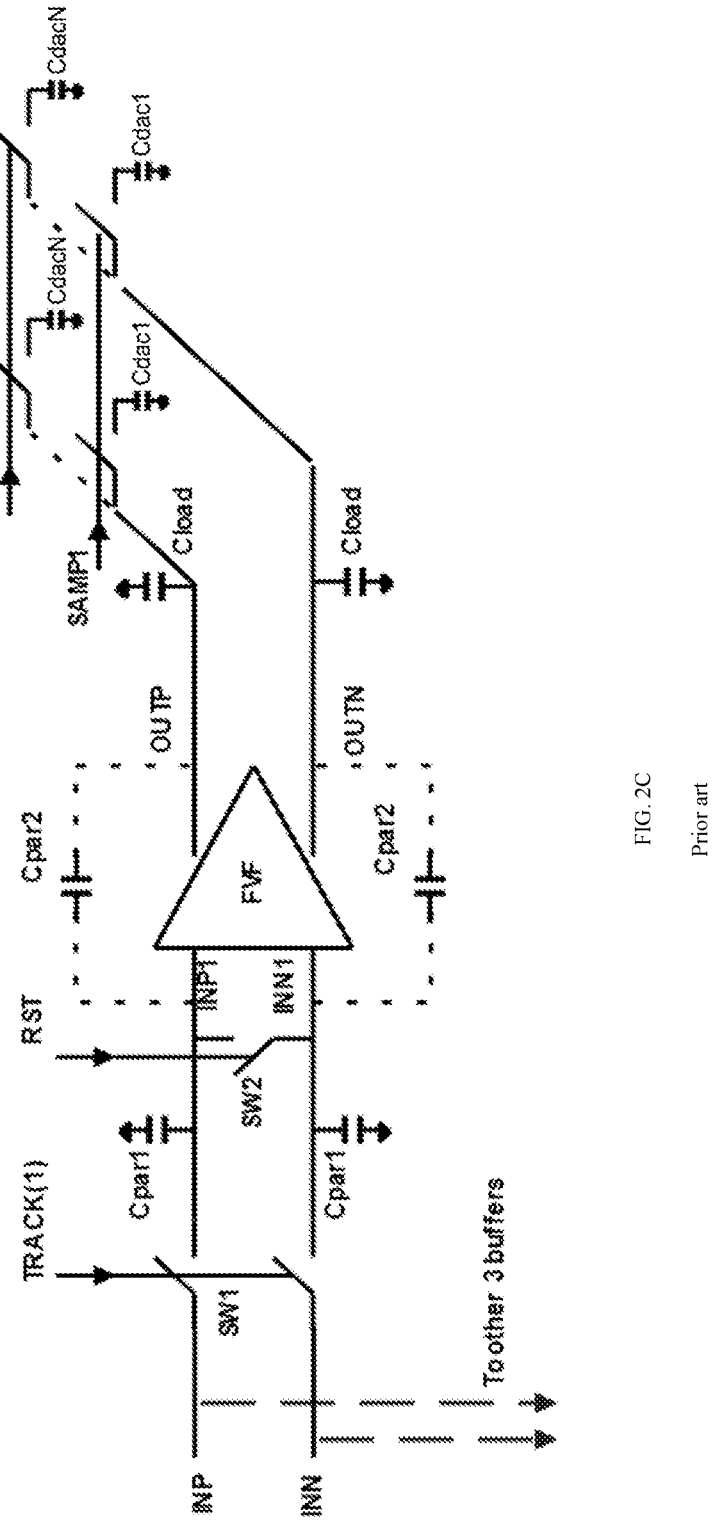
FIG. 2C illustrates an interleaved track and hold buffer in prior art with interleaved load.
Figure 2D:
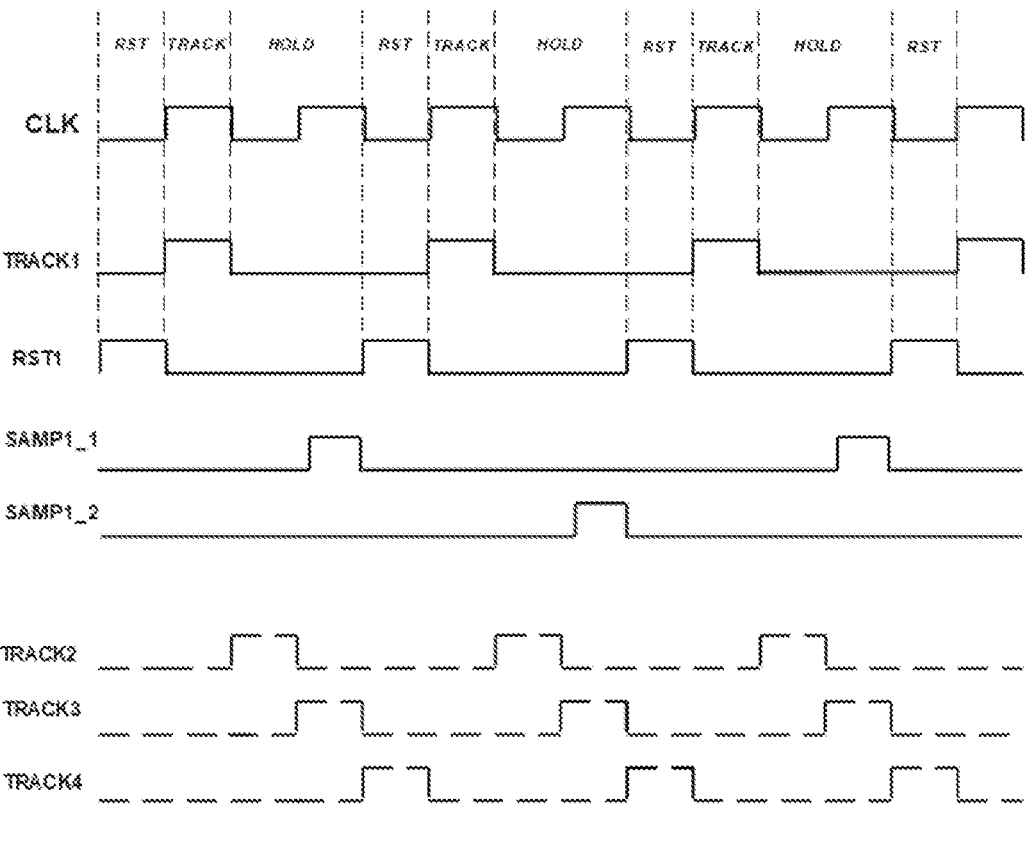
FIG. 2D illustrates possible control waveforms for the track and hold buffer in prior art for x2 output load interleaving.

FIGS. 2A to 2D illustrate the FVF buffer with capacitive feedback, reset, track and hold phases. FIG. 2A is a schematic diagram of an exemplary circuit for a single-end buffer. FIG. 2B is a schematic diagram of an exemplary circuit for a differential buffer. FIG. 2C illustrates a track and hold buffer with interleaved outputs. FIG. 2D illustrates possible control waveforms for this track and hold buffer.

FIG. 2A and FIG. 2B illustrate two conventional FVF buffer versions (single-end and fully differential) that can be used in the T&H buffer. FIG. 2C illustrates the case of T&H buffer which may be one of 4 interleaved buffers (input dash lines routed to other 3 possible interleaved buffers) with interleaved output samples, as shown in FIG. 2C, a reset switch (SW2) is connected between the inputs of the FVF buffer. FIG. 2D illustrates an example of control waveforms for 4 interleaved T&H buffers (corresponding to Track1 to Track4, since only one buffer is shown in FIG. 2C, no reset signals are shown for other possible 3 buffers), which means that the interleaved input factor is equal 4. It should be noted that, FIG. 2D illustrates waveforms of only 2 output sample switches (SAMP1_1, SAMP1_2), while there can be N output branches as shown in FIG. 2C.

In an example, as shown in FIG. 2A, FVF uses capacitive feedback (Cfb) to keep transistor M2 in operational (saturation) zone. Negative feedback through a path of Rfb Cfb provides an additional gain for reduction of the output resistance (Rout). Loop stability is guaranteed by a relatively low value of resistor Rfb. The main pole is set by Rout*Cload, while the high frequency secondary pole is set by Rfb and Cp1, Cp2. Since the current through Rfb changes during transient slope, the voltage difference on Cfb is not constant during signal convergence. Rflt path keeps to be constant an average charge of Cfb, while average bias of the gate of transistor M2 is controlled by an external current source Icur and the current mirror master on transistor M3. The differential buffer in FIG. 2B is similar to the single-end buffer in FIG. 2A, which is not repeated here for brevity.

Regarding operation of the above T&H buffer, with reference to FIGS. 2C and 2D, there are 3 sub-cycles, that is, reset (RST), track and hold phases. During an active pulse of a reset signal (reset phase, ¼ cycle), inputs (INP1 and INN1) of the FVF buffer are equalized (SW2 is ON, SW1 is OFF). As a result, outputs (OUTP/OUTN) devices are also equalized with some transient delay. During an active pulse of a track signal (track phase, ¼ cycle), the buffer input capacitors (Cpar1) are charged to the input voltages (SW1 is ON, SW2 is OFF). Outputs (OUTP/OUTN) of the FVF buffer begin to track the inputs per FVF speed (limited by its bandwidth). During a hold phase (²⁄4 cycle, SW1 is OFF, SW2 is OFF), outputs (OUTP/OUTN) of the FVF buffer continue the conversion process and are ready to be sampled by one of the fanouts. During an active pulse of a sample signal (SAMP), where the active sample time can be equal to the hold phase time or less than the hold phase time, the outputs can be sampled through one of the SAMP1 to SAMPN switches with final convergence to steady DC levels.

High speed requirements create a direction to use simple and popular FVF featuring low output resistance and wide bandwidth. Yet for the latest SERDES RX system, the buffer bandwidth is not wide enough to track the input signal at the buffer output at high frequencies, and output convergence of the buffer may partly move into the hold phase.

In view of the aforementioned track and hold buffer, there may be at least the following drawbacks: (1) The relatively big reset switch (SW2) increases Cpar1 and reduces bandwidth (BW) of the input switch SW1. (2) A separate reset (RST) signal takes about ¼ time from the total cycle time. (3) High frequency memory resulting from final FVF BW and only partial output charge during the active track signal together with relatively small Cpar1 create a memory related problem caused by positive feedback through Cpar2 which impacts THD of the buffer. (4) No buffer current management per clock phases (RST, TRACK, HOLD) for power consumption optimization. (5) No slew rate related current boost in order to improve the output convergence performance of the buffer.

Figure 3A:
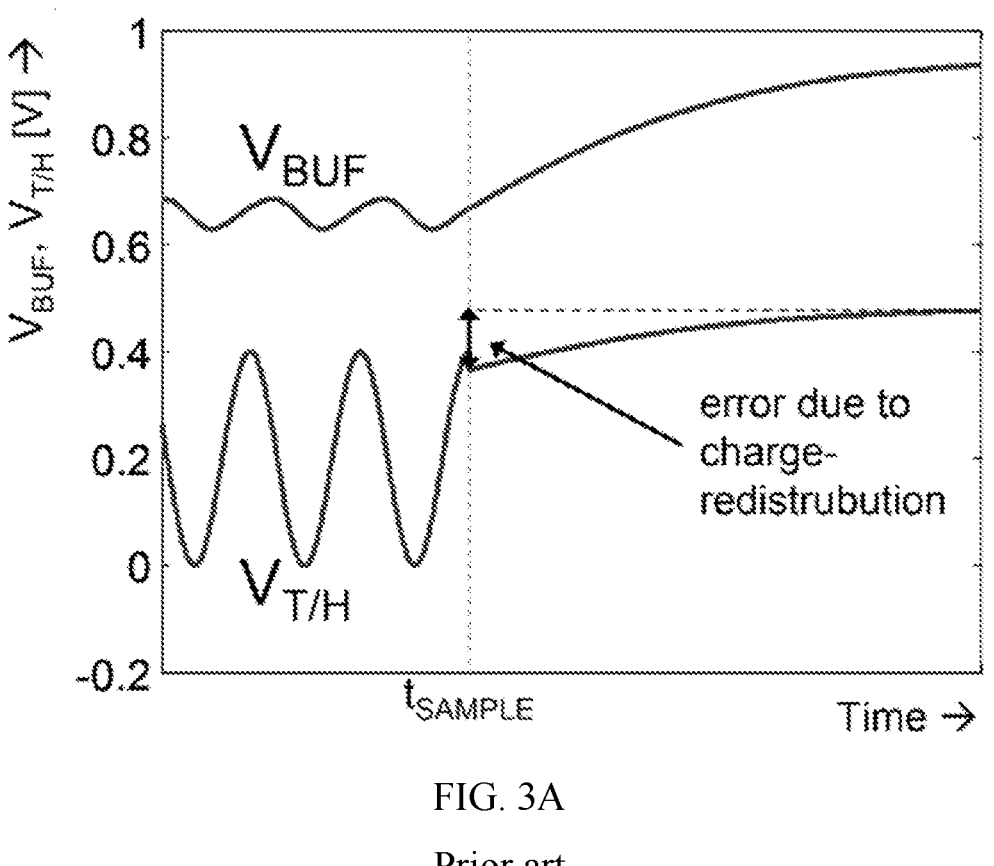
FIG. 3A is a waveform illustrating kick-back problem related to memory of a conventional buffer.
Figure 3B:
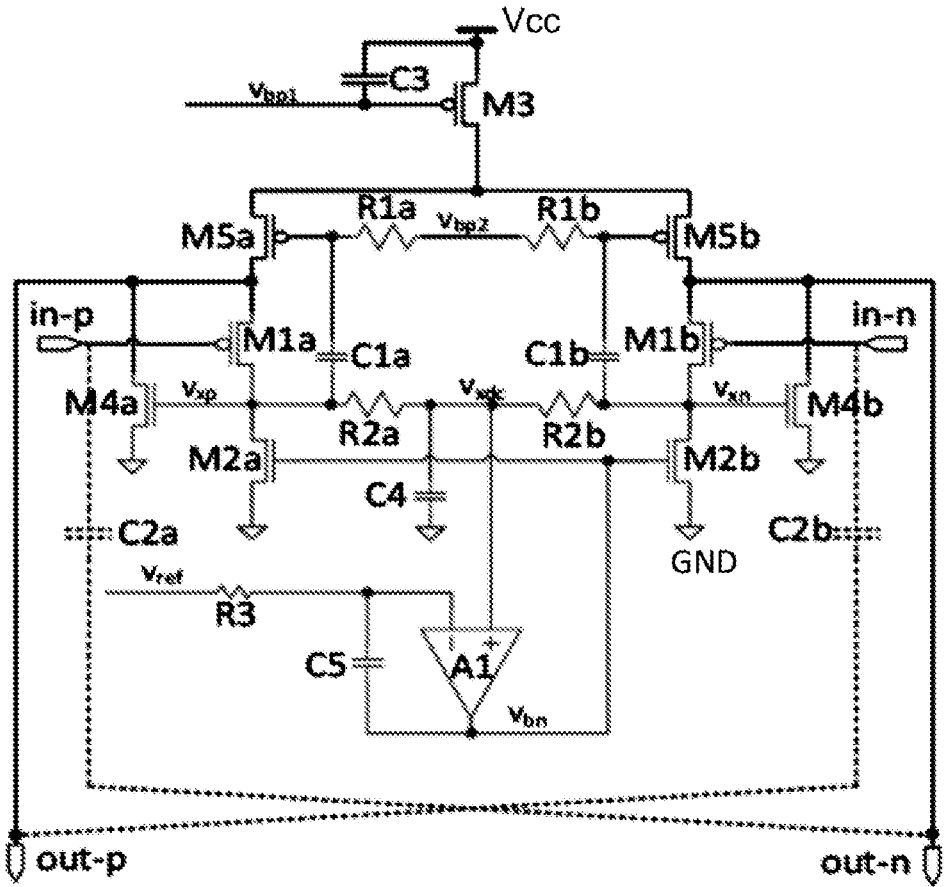
FIG. 3B is a schematic diagram of a previous art buffer with negative capacitive feedback fixing kickback.

The memory related problem is a well-known problem. As shown in FIG. 3A (known art), during an active pulse of a track signal, the buffer output VBUF cannot follow the input signal VT/H and at the sample moment (tSAMPLE), the output signal is not yet fully settled and its voltage value is not defined, it can have different values depending on the input signal frequency and buffer bandwidth. After the sample event ends, output VBUF will slowly settle to its final value. The charge-redistribution between buffer input-output parasitic capacitor (e.g., Cpar2 in FIG. 2C) and the sample capacitor (the capacitor for storing a sampled voltage, e.g., Cpar1 in FIG. 2C) during output conversion causes distortion in the voltage on the sample capacitor and as a result distortion of the buffer output voltage. There may be at least two ways for overcoming this issue. One option is increasing FVF BW by increasing its current, which may result in more power consumption. The other option is adding negative feedback in opposite direction to compensate positive feedback, providing kickback compensation with x-cross capacitors C2a/C2b as shown in FIG. 3B (previous art), which may increase the total load on the input switch and reduce its bandwidth.

Figure 4A:
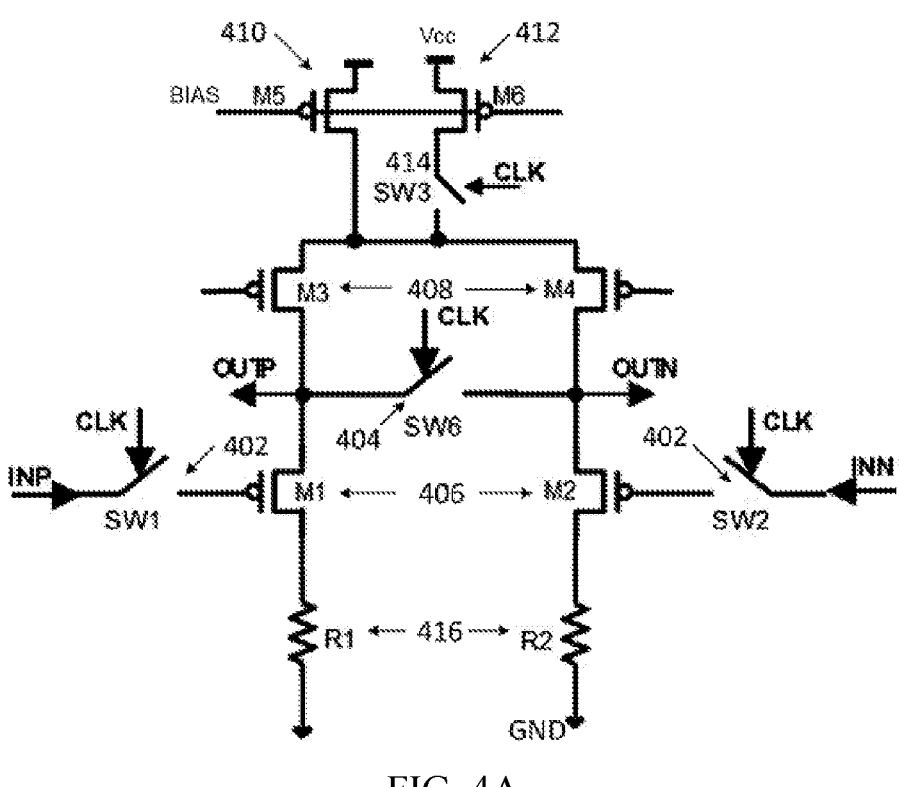
FIG. 4A is a schematic diagram of an exemplary circuit of a modified track and hold buffer according to one or more embodiments of the present disclosure.
Figure 4B:
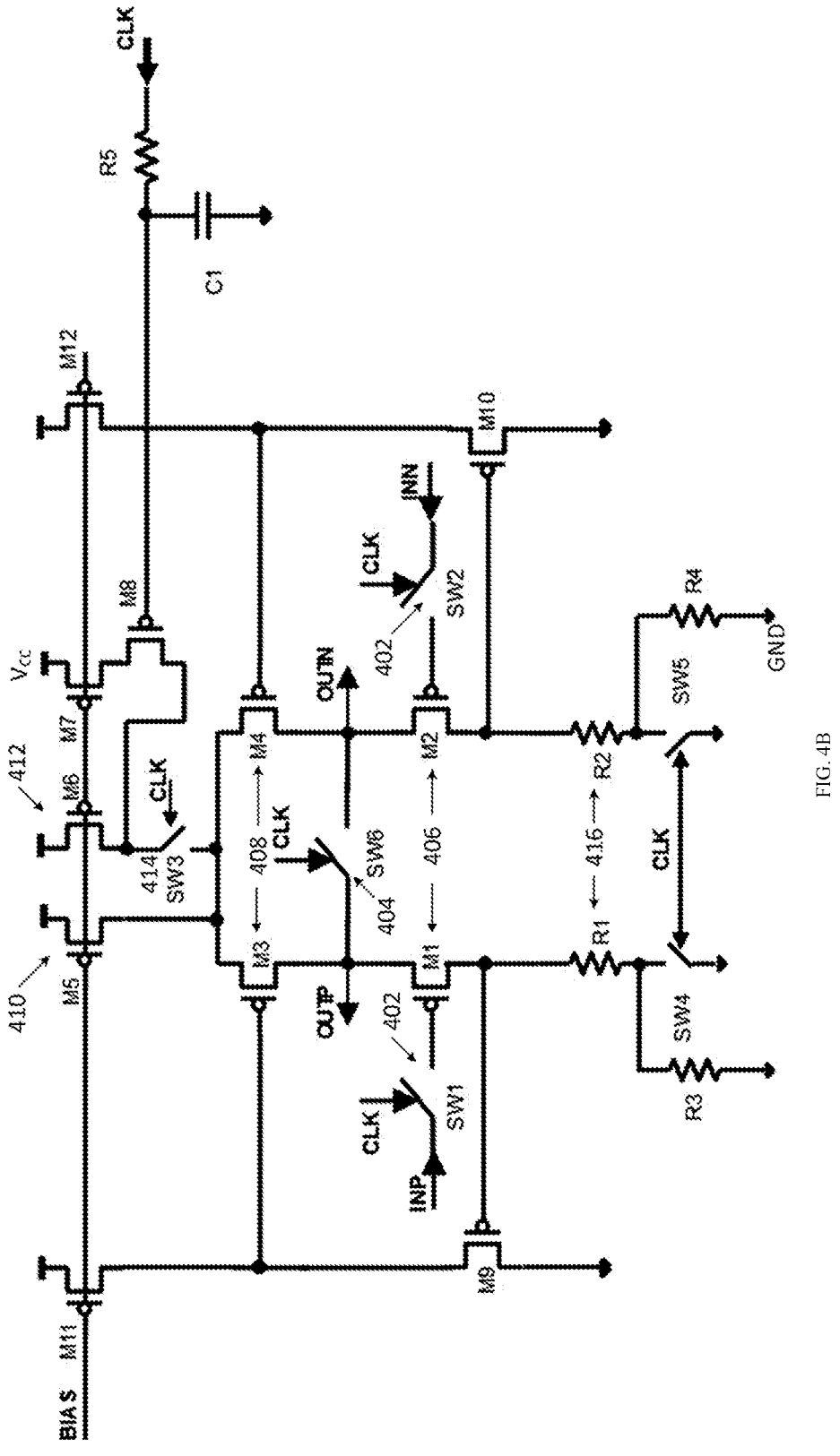
FIG. 4B is another schematic diagram of an exemplary circuit of a modified track and hold buffer according to one or more embodiments of the present disclosure.

In view of the above, the present disclosure proposes a track and hold circuit/buffer. As shown in FIGS. 4A-4B, the track and hold circuit includes: a Complementary Metal Oxide Semiconductor (CMOS) flipped voltage follower (FVF), a pair of first switches 402 and a second switch 404, where the FVF includes a pair of first transistors 406, a pair of second transistors 408, a first current mirror transistor 410, a second current mirror transistor 412 and a third switch 414.

The track and hold circuit will be described with reference to FIGS. 4A-4B. The pair of first transistors may correspond to transistors M1 and M2 in FIGS. 4A-4B, while the pair of second transistors may correspond to transistors M3 and M4 in FIGS. 4A-4B. The pair of first switches may correspond to switches SW1 and SW2 in FIGS. 4A-4B. The second switch may correspond to switch SW6 in FIGS. 4A-4B. The first current mirror transistor may correspond to transistor M5 in FIGS. 4A-4B. The second current mirror transistor may correspond to transistor M6 in FIGS. 4A-4B. The third switch may correspond to switch SW3 in FIGS. 4A-4B.

The FVF has a pair of differential inputs (e.g., INP and INN in FIGS. 4A-4B) and a pair of differential outputs (e.g., OUTP and OUTN in FIGS. 4A-4B). Gates of the pair of first transistors are the differential inputs of the FVF and sources thereof are the differential outputs of the FVF. Each of the first switches being coupled between a corresponding one of differential signal inputs and a corresponding one of differential inputs of the FVF. The second switch is coupled between differential outputs of the FVF. It should be noted that, throughout the text, a pair of differential signal inputs may be also referred to as differential signal inputs, which means two signal inputs; and a pair of differential inputs/outputs may be also referred to as differential inputs/outputs, which means two inputs/outputs.

The first current mirror transistor (e.g., M5 in FIGS. 4A-4B) is coupled between a first supply (e.g., VCC in FIGS. 4A-4B) and sources of the second transistors (e.g., M3 and M4 in FIGS. 4A-4B); drains of the second transistors are respectively coupled to sources of the first transistors (e.g., M1 and M2 in FIGS. 4A-4B), drains of the first transistors 406 are respectively coupled to first ends of first resistors 416 (e.g., R1 and R2 in FIGS. 4A-4B), and second ends of the first resistors 416 are connected to a second supply. It should be noted that, the second ends of the first resistors 416 may be directly connected to the second supply (e.g., GND) as shown in FIG. 4A; and may also be indirectly connected to the second supply, e.g., through respective switches, as shown in FIG. 4B.

The second current mirror transistor (e.g., M6 in FIGS. 4A-4B) is coupled between the first supply and a first end of the third switch (e.g., SW3 in FIGS. 4A-4B), and a second end of the third switch is coupled to the sources of the second transistors; where gates of the first current mirror transistor and the second current mirror transistor are coupled to a bias voltage.

The FVF is configured to receive a pair of differential input signals from the pair of differential signal inputs (e.g., INP and INN in FIGS. 4A-4B) through the pair of differential inputs of the FVF, and output a pair of differential output signals through the pair of differential outputs (e.g., OUTP and OUTN in FIGS. 4A-4B) of the FVF.

Figure 4C:
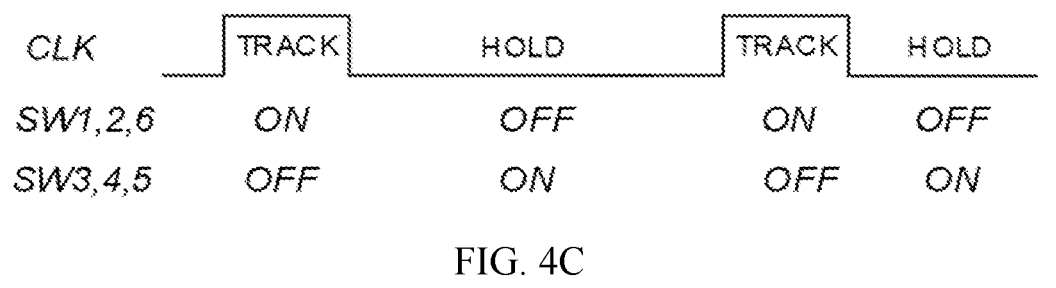

A state of the second switch is controlled by a clock signal to be the same as a state of each of the first switches, and a state of the third switch is controlled to be complementary to the state of the second switch. The clock signal for all switches in FIGS. 4A-4B is shown in FIG. 4C. During track phase (e.g., the clock signal is set high), the first switches and the second switch are ON, while the third switch is OFF. The input voltages begin to build up on sample capacitors, the sample capacitors are not shown in FIGS. 4A-4B and as one possible implementation, they can be parasitic capacitors of M1 and M2. During hold phase (e.g., the clock signal is set low), the first switches and the second switch are OFF, while the third switch is ON. At this time, the buffer is disconnected from the differential input signals.

The second switch (e.g., SW6 in FIGS. 4A-4B) is located between the buffer outputs and is controlled by the clock signal, this can guarantee the same initial conditions at the buffer outputs by the end of the active pulse of the clock signal (e.g., TRACK shown in FIG. 4C). In the solution proposed by the present disclosure, the second switch is no longer set at the buffer input, which improves the bandwidth of the first switches (e.g., SW1 and SW2 in FIGS. 4A-4B). In addition, instead of using a separate reset signal, the same clock signal which is used for controlling the first switches is now also used for controlling the second switch associated with the resetting of the FVF, thus providing more time for the convergence at the hold phase during the conversion.

The first current mirror transistor is always working, keeping minimum current for differential branches (e.g., M1-M4 in FIGS. 4A-4B). The second current mirror transistor is operating when the third switch (e.g., SW3 in FIGS. 4A-4B) is ON (conductive) providing required current (much bigger than the current provided by the first current mirror) for the buffer's successful convergence during the hold phase. Since the output signal convergence is blocked during the track phase by the reset switch (e.g., SW6 in FIGS. 4A-4B), the introduction of the second current mirror is dedicated to reduce the buffer's current during the track phase and increase the buffer's current during the hold phase. Low current through differential branches during the track phase improves equalization of the buffer differential outputs (reset) simultaneously keeping internal nodes near dedicated full current operational points of the hold phase.

In a possible implementation, the FVF further includes a third current mirror transistor and an additional current control circuit; where the additional current control circuit includes a Resistance-Capacitance (RC) low-pass filter circuit and a third transistor. Referring to FIG. 4B, the third current mirror transistor may correspond to transistor M7 in FIG. 4B. The RC low-pass filter circuit may refer to R5 and
C1 in FIG. 4B. The third transistor may correspond to
transistor M8 in FIG. 4B.

The third current mirror transistor is coupled between the
first supply and a source of the third transistor, where a gate
of the third current mirror transistor is coupled to the bias
voltage, and a drain of the third transistor is coupled to the
first end of the third switch; where an output of the RC
low-pass filter circuit is coupled to a gate of the third
transistor, and an input of the RC low-pass filter circuit is
connected to a clock signal which controls the state of the
third switch.

With the above structure, current boost occurs at the
beginning of the hold phase, and slew rate of the buffer can
thus be improved.

In a possible implementation, the second ends of the first
resistors are connected to the second supply through respec-
tive switches, and the track and hold circuit further includes:
a pair of fourth switches and a pair of second resistors;
where each of the fourth switches is coupled between a
second end of a corresponding first resistor and the second
supply, and each of the second resistors is coupled between
the second end of the corresponding first resistor and the
second supply. Still referring to FIG. 4B, the pair of fourth
switches may correspond to switches SW4 and SW5 in FIG.
4B. The pair of second resistors may correspond to R3 and
R4 in FIG. 4B.

A state of each of the fourth switches is controlled by a
clock signal and a phase of each of the fourth switches is the
same as a phase of the third switch. Still referring to FIG.
4C, during track phase (e.g., the clock signal is set high), the
first switches and the second switch are ON, while the fourth
switches and the third switch are OFF. During hold phase
(e.g., the clock signal is set low), the first switches and the
second switch are OFF, while the fourth switches and the
third switch are ON.

With the above structure, the buffer's current can be
reduced during track phase and the reset conditions can be
relaxed. In addition, the total power consumption of the
buffer can be reduced.

In a possible implementation, the track and hold circuit
further includes a pair of source follower configuration level
shifters, and each of the level shifters includes a fourth
current mirror transistor and a fourth transistor. Still refer-
ring to FIG. 4B, fourth current mirror transistors may
correspond to transistors M11 and M12 in FIG. 4B. Fourth
transistors may correspond to transistors M9 and M10 in
FIG. 4B.

A gate of the fourth current mirror transistor is coupled to
the bias voltage, a source of the fourth current mirror
transistor is coupled to the first supply, a drain of the fourth
current mirror transistor is coupled to a source of the fourth
transistor, and a drain of the fourth transistor is coupled to
the second supply. The drain of the fourth current mirror
transistor and the source of the fourth transistor are coupled
to the gate of a corresponding second transistor.

The capacitive feedback of the buffer in FIG. 2B is now
replaced by the source follower configuration level shifter,
compared to the feedback with Cfb capacitors, capacitor
charge uncertainty coming from the buffer current changes
can be avoided.

It should be noted that, gates and sources of the first/
second/third/fourth current mirror transistors (e.g., M5, M6,
M7, M11 and M12 shown in FIG. 4B) are respectively
coupled to the bias voltage and the first supply.

In a possible implementation, a first phase of the clock
signal is used for controlling the second switch and each of the first switches to be conductive, and controlling the third
and the fourth switches to be non-conductive. In a possible
implementation, a second phase of the clock signal is used
for controlling the second switch and each of the first
switches to be non-conductive, and controlling the third and
the fourth switches to be conductive. Here, as shown in FIG.
4C, the first phase of the clock signal is a high-level voltage,
while the second phase of the clock signal is a low-level
voltage. It should be noted that, in some cases, the first phase
of the clock signal may be a low-level voltage, while the
second phase of the clock signal may be a high-level
voltage, which is not limited in the present disclosure.

In a possible implementation, the first phase of the clock
signal indicates a track period during which the pair of
differential input signals is sampled at the gates of the first
transistors, while the second phase of the clock signal
indicates a hold period during which the pair of differential
output signals are converged. That is, when the clock signal
is set high, the differential input signals are sampled; and
when the clock signal is set low, the differential output
signals are converged. It should be noted that, in some cases,
the differential input signals may be sampled when the clock
signal is set low, while the differential output signals may be
converged when the clock signal is set high, which is not
limited in the present disclosure. It should also be noted that,
the track period may also be referred to as the aforemen-
tioned track phase, and the hold period may also be referred
to as the aforementioned hold phase.

In the present disclosure, all described MOS transistors of
the track and hold circuit may have the same polarity. For
example, all transistors (the first transistors, the second
transistors, the third transistor, the fourth transistors, the first
current mirror transistors, the second current mirror transis-
tors, the third current mirror transistor, the fourth current
mirror transistors) of the track and hold circuit are positive
Metal Oxide Semiconductor (PMOS) devices, in this case,
the first supply is a power supply (e.g., VCC) and the second
supply is a ground (GND). It should be noted that, all
transistors of the track and hold circuit can also be negative
Metal Oxide Semiconductor (NMOS) devices, and in this
case, the whole circuit is mirrored, the first supply is a
ground and the second supply is a power supply.

In order to elaborate the proposed track and hold buffer
more clearly, the modifications compared with the conven-
tional track and hold buffer will be described in the follow-
ing.

Figure 5A:
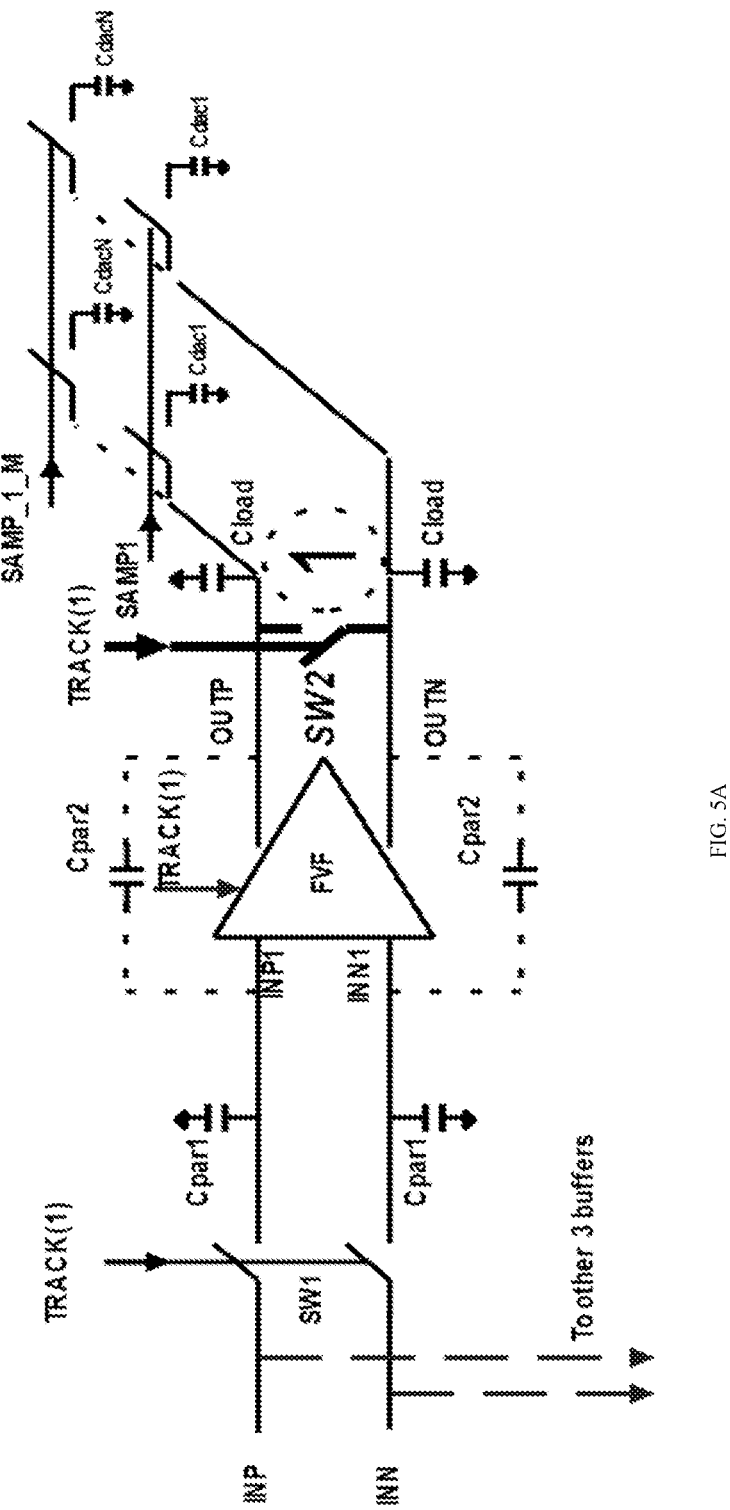
FIG. 5A is another schematic diagram of a modified track and hold buffer according to one or more embodiments of the present disclosure.
Figure 5B:
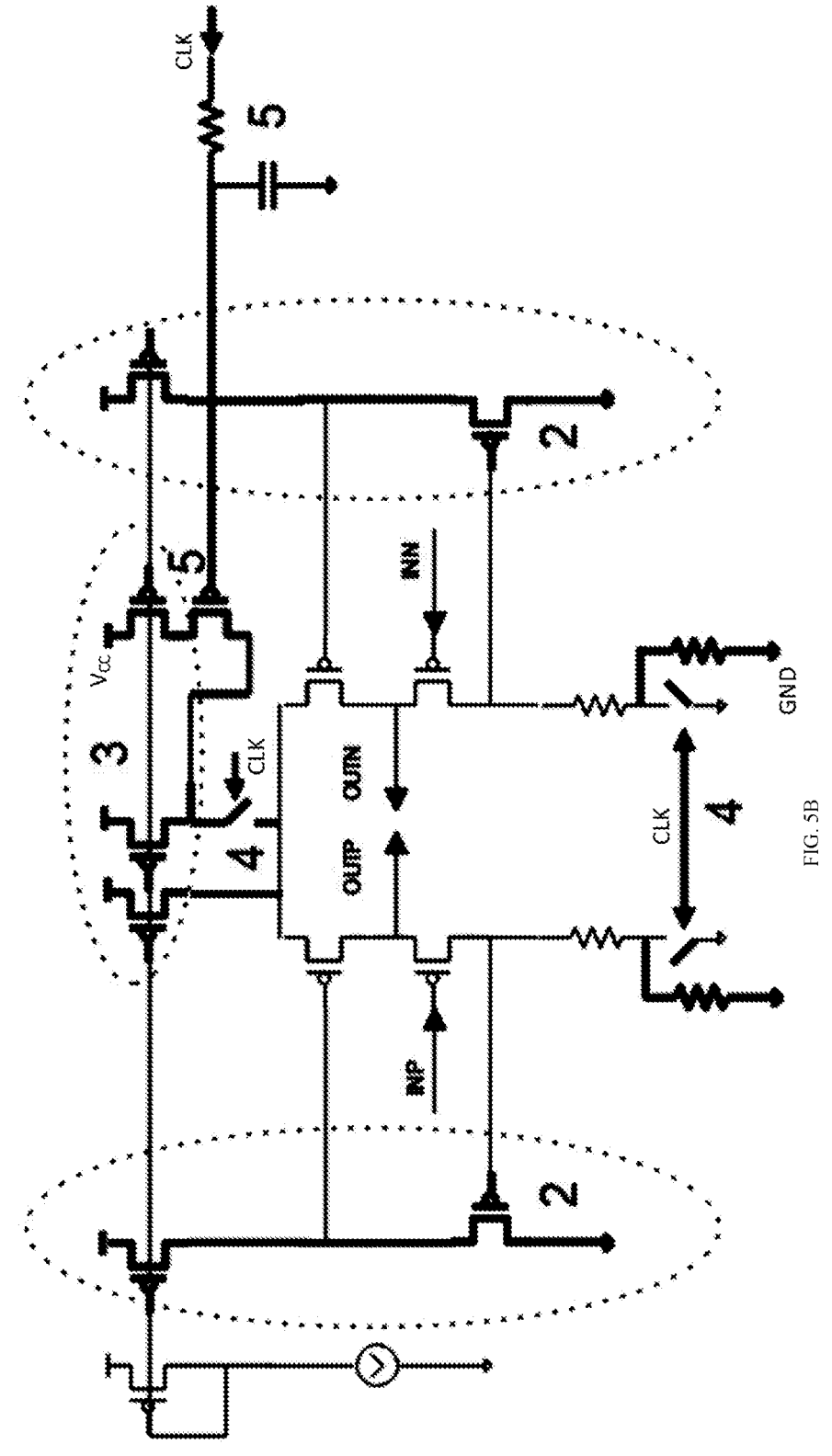
FIG. 5B is a schematic diagram of an exemplary circuit of a modified track and hold buffer according to one or more embodiments of the present disclosure.
Figure 5C:
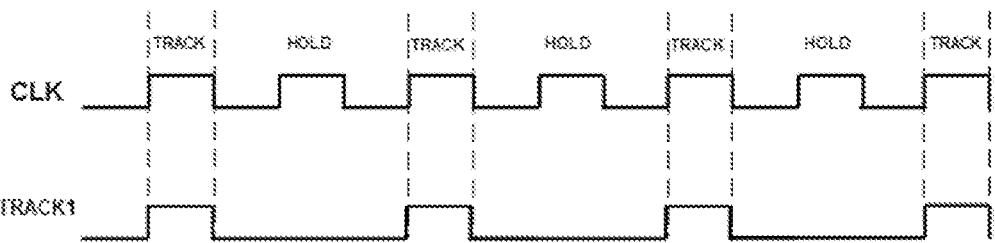
FIG. 5C illustrates control waves of a modified track and hold buffer according to one or more embodiments of the present disclosure.
Figure 5C:
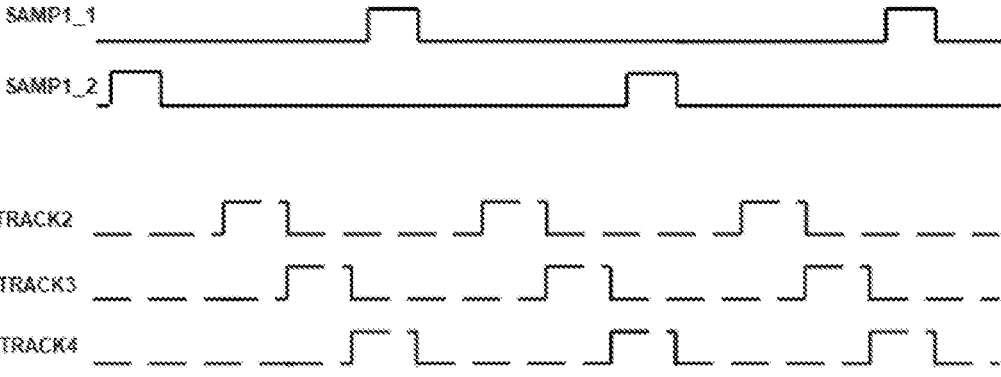
Figure 5D:
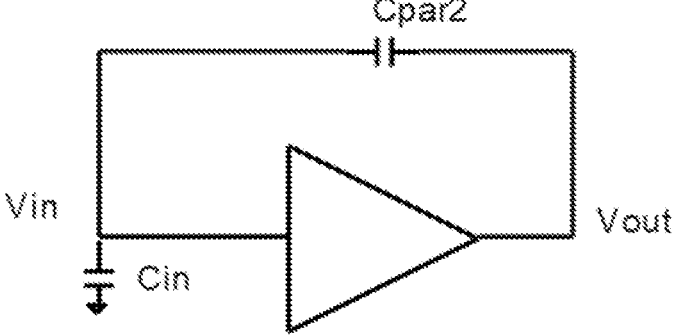
FIG. 5D illustrates gain of the modified track and hold buffer according to one or more embodiments of the present disclosure.

FIG. 5A illustrates a track and hold buffer with a reset
switch at the buffer output controlled by a track signal. Here
input/output switches of the buffer are shown outside of the
buffer symbol for simplicity of explanation. FIG. 5B illus-
trates buffer changes for improving THD and slew rate (this
picture does not include input/output switches). FIG. 5C
illustrates control waves without a separate reset signal for
the track and hold buffer. FIG. 5D illustrates gain improve-
ment of the modified track and hold buffer.

It should be noted that, FIG. 5A may have a correspon-
dence with FIGS. 4A-4B, where the input switch (SW1) in
FIG. 5A may correspond to the first switches (SW1 and
SW2) in FIGS. 4A-4B, and the reset switch SW2 in FIG. 5A
may correspond to the second switch (SW6) in FIGS.
4A-4B.

In order to improve the bandwidth of the input switch, and
to guarantee the same initial conditions at the buffer outputs
by the end of the active pulse of the track signal (and stop
input signal frequency depending on kick-back), the reset
switch at the input of the track and hold buffer (see FIG. 2C)
is deleted, instead, the reset switch (the aforementioned second switch) is now put at the output of the track and hold buffer (see FIG. 5A). In order to increase the total time allocated for hold phase and signal convergence, a separate reset signal in FIG. 2D is eliminated and the reset is combined with the track signal (see FIG. 5A #1). No separate reset signal adds ¼ cycle for the hold phase and signal convergence. The signal for controlling the reset switch is the track signal and keeps output in the reset mode during the track phase. The reset at the buffer outputs created by the active pulse of the track signal keeps the buffer outputs equalized during the track phase, which fixes kick-back problem and THD issue caused by parasitic Cin_out (Cpar2) of the buffer.

To overcome Cfb capacitors charge uncertainty related to current changes of the buffer, the capacitive feedback is replaced by level shifter (see FIG. 5B #2).

Since the output signal convergence is blocked during the active pulse of the track signal (both outputs are connected together), a split current mirror (see FIG. 5B #3) and additional two switches (see FIG. 5B #4) are added in order to reduce buffer's current during the track phase and relax reset conditions for the buffer outputs. This design also reduces the total power consumption of the buffer.

To improve slew rate at the beginning of hold phase, a special RC circuit with an additional current mirror (see FIG. 5B #5) is added, where current boost strength and time may be easily controlled.

In addition, in order to adjust operational points of feedback devices (transistors 408 in FIGS. 4A-4B) to the level shifters (#2 in FIG. 5B) output levels and simultaneously improve Power Supply Rejection Ratio (PSRR), the differential pair approach with common current mirror tail may be chosen for these feedback devices (see FIG. 3B).

In summary, the modifications help to improve the bandwidth of the input switch, the THD performance and the conversion speed. Specifically, the reset switch located at the buffer input is replaced by a reset switch located at the buffer output, improving the bandwidth of the input switch. Absence of no dedicated reset signal improves the hold phase time of the conversion. Keeping the buffer in the reset state during track phase fixes THD issue related to the buffer bandwidth and parasitic Cin_out kick-back, converting it from negative factor to positive, that is, buffer gain is increased. Current boost at the beginning of the hold phase improves slew rate of the buffer and its convergence time during hold phase. Capacitive feedback replaced by level shifter feedback enables the current management of the buffer during different clock phases without any memory issues. Feedback using level shifters plus current switches achieves current reduction during track phase and relaxes reset convergence. The total power consumption of the buffer is also reduced.

In the present disclosure, the differential inputs of the buffer are only illustrative but not restrictive, it should be noted that, a single-end buffer is also possible. The technical concept can be applied to a single or interleaved track and hold design, which may be used in a receiver for successive approximation register (SAR) analog-to-digital converter (ADC), e.g., a serializer/deserializer (SERDES) receiver (RX).

The embodiments may further be described using the following clauses.

1. A track and hold circuit, including:
a Complementary Metal Oxide Semiconductor (CMOS) flipped voltage follower (FVF) having a pair of differential inputs and a pair of differential outputs;

a pair of first switches, each of the first switches being coupled between a corresponding one of a pair of differential signal inputs and a corresponding one of the pair of differential inputs of the FVF;
a second switch coupled between the pair of differential outputs of the FVF;
where the FVF includes a pair of first transistors with gates being the differential inputs of the FVF and sources being the differential outputs of the FVF, a pair of second transistors, a first current mirror transistor, a second current mirror transistor and a third switch; where the first current mirror transistor is coupled between a first supply and sources of the second transistors; drains of the second transistors are respectively coupled to sources of the first transistors, drains of the first transistors are respectively coupled to first ends of first resistors, and second ends of the first resistors are connected to a second supply;
where the second current mirror transistor is coupled between the first supply and a first end of the third switch, and a second end of the third switch is coupled to the sources of the second transistors; where gates of the first current mirror transistor and the second current mirror transistor are coupled to a bias voltage;
where the FVF is configured to receive a pair of differential input signals from the pair of differential signal inputs through the pair of differential inputs of the FVF, and output a pair of differential output signals through the pair of differential outputs of the FVF;
where a state of the second switch is controlled by a clock signal to be the same as a state of each of the first switches, and a state of the third switch is controlled to be complementary to the state of the second switch.

2. The track and hold circuit according to clause 1, where the FVF further includes a third current mirror transistor and an additional current control circuit; where the additional current control circuit includes a Resistance-Capacitance (RC) low-pass filter circuit and a third transistor;
where the third current mirror transistor is coupled between the first supply and a source of the third transistor, and a drain of the third transistor is coupled to the first end of the third switch; where a gate of the third current mirror transistor is coupled to the bias voltage; where an output of the RC low-pass filter circuit is coupled to a gate of the third transistor, and an input of the RC low-pass filter circuit is connected to a clock signal which controls the state of the third switch.

3. The track and hold circuit according to clause 1 or 2, where the second ends of the first resistors are connected to the second supply through respective switches, and the track and hold circuit further includes: a pair of fourth switches and a pair of second resistors;
where each of the fourth switches is coupled between a second end of a corresponding first resistor and the second supply, and each of the second resistors is coupled between the second end of the corresponding first resistor and the second supply;
where a state of each of the fourth switches is controlled by a clock signal and a phase of each of the fourth switches is the same as a phase of the third switch.

4. The track and hold circuit according to clause 3, where a first phase of the clock signal controls the second switch and each of the first switches to be conductive, and controls the third switch and each of the fourth switches to be non-conductive.

5. The track and hold circuit according to clause 4, where a second phase of the clock signal controls the second switch and each of the first switches to be non-conductive, and controls the third switch and each of the fourth switches to be conductive.

6. The track and hold circuit according to any one of clauses 1 to 5, further including a pair of source follower configuration level shifters, and each of the level shifters includes a fourth current mirror transistor and a fourth transistor;

where a gate of the fourth current mirror transistor is coupled to the bias voltage, a source of the fourth current mirror transistor is coupled to the first supply, a drain of the fourth current mirror transistor is coupled to a source of the fourth transistor, and a drain of the fourth transistor is coupled to the second supply;

where the drain of the fourth current mirror transistor and the source of the fourth transistor are coupled to the gate of a corresponding second transistor.

7. The track and hold circuit according to any one of clauses 1 to 6, where a first phase of the clock signal controls the second switch and each of the first switches to be conductive, and controls the third switch to be non-conductive.

8. The track and hold circuit according to clause 7, where a second phase of the clock signal controls the second switch and each of the first switches to be non-conductive, and controls the third switch to be conductive.

9. The track and hold circuit according to clause 8, where the first phase of the clock signal indicates a track period during which the pair of differential input signals is sampled at the gates of the first transistors, while the second phase of the clock signal indicates a hold period during which the differential output signals are converged.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may include a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

Although embodiments have been described above with reference to the accompanying drawings, those of skill in the art will appreciate that variations and modifications may be made without departing from the scope thereof as defined by the appended claims.

What is claimed is:

1. A track and hold circuit, comprising:
a Complementary Metal Oxide Semiconductor (CMOS) flipped voltage follower (FVF) having a pair of differential inputs and a pair of differential outputs;
a pair of first switches, each of the first switches being coupled between a corresponding one of a pair of differential signal inputs and a corresponding one of the pair of differential inputs of the CMOS FVF; and a second switch coupled between the pair of differential outputs of the CMOS FVF;
wherein the CMOS FVF comprises a pair of first transistors with gates being the differential inputs of the CMOS FVF and sources being the differential outputs of the CMOS FVF, a pair of second transistors, a first current mirror transistor, a second current mirror transistor and a third switch; wherein the first current mirror transistor is coupled between a first supply and sources of the second transistors; drains of the second transistors are respectively coupled to sources of the first transistors, drains of the first transistors are respectively coupled to first ends of first resistors, and second ends of the first resistors are connected to a second supply;
wherein the second current mirror transistor is coupled between the first supply and a first end of the third switch, and a second end of the third switch is coupled to the sources of the second transistors; wherein gates of the first current mirror transistor and the second current mirror transistor are coupled to a bias voltage;
wherein the CMOS FVF is configured to receive a pair of differential input signals from the pair of differential signal inputs through the pair of differential inputs of the CMOS FVF, and output a pair of differential output signals through the pair of differential outputs of the CMOS FVF;
wherein a state of the second switch is controlled by a clock signal to be the same as a state of each of the first switches, and a state of the third switch is controlled to be complementary to the state of the second switch.

2. The track and hold circuit according to claim 1, wherein the CMOS FVF further comprises a third current mirror transistor and an additional current control circuit; wherein the additional current control circuit comprises a Resistance-Capacitance (RC) low-pass filter circuit and a third transistor;
wherein the third current mirror transistor is coupled between the first supply and a source of the third transistor, and a drain of the third transistor is coupled to the first end of the third switch; wherein a gate of the third current mirror transistor is coupled to the bias voltage; and
wherein an output of the RC low-pass filter circuit is coupled to a gate of the third transistor, and an input of the RC low-pass filter circuit is connected to a clock signal which controls the state of the third switch.

3. The track and hold circuit according to claim 1, wherein the second ends of the first resistors are connected to the second supply through respective switches, and the track and hold circuit further comprises: a pair of fourth switches and a pair of second resistors;
wherein each of the fourth switches is coupled between a second end of a corresponding first resistor and the second supply, and each of the second resistors is coupled between the second end of the corresponding first resistor and the second supply; and
wherein a state of each of the fourth switches is controlled by a clock signal and a phase of each of the fourth switches is the same as a phase of the third switch.

4. The track and hold circuit according to claim 3, wherein a first phase of the clock signal is used for controlling the second switch and each of the first switches to be conductive, and controlling the third switch and each of the fourth switches to be non-conductive.

5. The track and hold circuit according to claim 4, wherein a second phase of the clock signal is used for controlling the second switch and each of the first switches to be non-conductive, and controlling the third switch and each of the fourth switches to be conductive.

6. The track and hold circuit according to claim 1, further comprising a pair of source follower configuration level shifters, and each of the pair of source follower configuration level shifters comprises a fourth current mirror transistor and a fourth transistor;

> wherein a gate of the fourth current mirror transistor is coupled to the bias voltage, a source of the fourth current mirror transistor is coupled to the first supply, a drain of the fourth current mirror transistor is coupled to a source of the fourth transistor, and a drain of the fourth transistor is coupled to the second supply; and
>
> wherein the drain of the fourth current mirror transistor and the source of the fourth transistor are coupled to a gate of a corresponding second transistor.

7. The track and hold circuit according to claim 1, wherein a first phase of the clock signal is used for controlling the second switch and each of the first switches to be conductive, and controlling the third switch to be non-conductive.

8. The track and hold circuit according to claim 7, wherein a second phase of the clock signal is used for controlling the second switch and each of the first switches to be non-conductive, and controlling the third switch to be conductive.

9. The track and hold circuit according to claim 8, wherein the first phase of the clock signal indicates a track period during which the pair of differential input signals is sampled at the gates of the first transistors, while the second phase of the clock signal indicates a hold period during which the differential output signals are converged.

\*　\*　\*　\*　\*